United States Patent [19]

Nakano et al.

[11] Patent Number: 5,396,466
[45] Date of Patent: Mar. 7, 1995

[54] METHOD OF TESTING BIT LINES OF A MEMORY UNIT

[75] Inventors: Rikizo Nakano; Noriyuki Matsui, both of Kawasaki, Japan

[73] Assignee: Fujitsu Limited, Kawasaki, Japan

[21] Appl. No.: 214,449

[22] Filed: Mar. 17, 1994

[30] Foreign Application Priority Data

Apr. 27, 1993 [JP] Japan .................. 5-099961

[51] Int. Cl.$^6$ .............................. G11C 7/00
[52] U.S. Cl. .................. 365/201; 365/230.04; 365/230.03
[58] Field of Search .............. 365/201, 230.04, 230.03, 365/230.01, 189.01

[56] References Cited

U.S. PATENT DOCUMENTS 4,849,937  7/1989  Yoshimoto ............... 365/230.04
5,331,594  7/1994  Hotta ....................... 365/201

Primary Examiner—Eugene R. LaRoche
Assistant Examiner—A. Zarabian
Attorney, Agent, or Firm—Staas & Halsey

[57] ABSTRACT

A method of testing bit lines of a memory unit includes the steps of alternately writing a set of first binary values and a set of inverted first binary values to blocks having even block values and to blocks having odd block values for all storage elements within each of a plurality of blocks of the memory unit; setting the memory unit to a stressed condition; alternately reading pieces of binary data from first-row storage elements of the blocks having even block values and from final-row storage elements of the blocks having odd block values by repeatedly inverting a row value of a memory address and incrementing a block value of the memory address for each block; setting the memory unit to a normal condition; and repeating the first setting step, the alternate reading step, and the second setting step for all the columns of the plurality of the blocks.

7 Claims, 5 Drawing Sheets

METHOD OF TESTING BIT LINES OF A MEMORY UNIT

BACKGROUND OF THE INVENTION

1. Field of the Invention

The present invention relates to a method of testing bit lines of a memory unit, such as an integrated circuit (IC) memory chip, by accessing storage elements of each of a plurality of blocks of the memory unit.

2. Description of the Prior Art

Several proposed methods of testing memory units, such as IC memory chips, are known and include for example, (A) memory scanning, (B) marching, and (C) galloping.

(A) The memory scanning method is a memory unit testing method by which all the bits of data read from the storage elements of the memory unit are tested by sequentially incrementing the address of the memory unit.

(B) The marching method is a similar memory unit testing method. In the marching method, all the bits of data read from the storage elements of a memory unit are tested by sequentially incrementing the address of the memory unit, similarly to the above memory scanning method. In the case of the marching method, initial values, for example, zeros, are written to the memory unit. The zeros are read from and inverted values "ones" are written to the storage elements of the memory unit. This procedure is repeated by sequentially incrementing the memory unit address. It is then detected whether or not all the values finally read from the storage elements of the memory unit are equal to one.

(C) The galloping method is a different memory unit testing method. In the galloping method, it is detected whether or not the binary data read from the storage elements of a memory unit, after the binary data is written to any of the storage elements, interfere with each other. For example, after binary data is written to the storage element at the address 0 of the memory unit, the binary data is read from the storage elements at the addresses 0 and 1 and it is detected whether the interference of the data occurs or not. This is repeated until the combination of the first address 0 and the final address is checked for the interference of the data. The same procedures are repeatedly performed by writing the binary data to each of the storage elements at the remaining addresses other than the address 0. If the memory unit addresses, range from 0 to N, it is necessary to repeat the testing control procedures $N^2$ times. Thus, if the storage capacity of the memory unit is increased, a very long testing time is required.

For recent microminiaturized memory units with high access speed, the noise due to high speed switching becomes not negligible, and the convergence time from the initial level to the final level at which the undershoot or overshoot converges is relatively great for the high access speed of the memory units. It is desirable to provide a testing method by which all the storage elements of a memory unit are efficiently tested with the testing time as short as possible.

In the meantime, the proposed methods described above are a normal mode testing procedure for detecting a failure in the storage elements of a memory unit. It should be noted that it is necessary to provide an efficient memory unit testing method of a different mode for detecting a failure in the bit lines of a memory unit.

In order to efficiently and accurately test a memory unit, it is desirable to detect not only a failure in the storage elements of the memory unit but also a failure in the bit lines of the memory unit. If one of the bit lines of the memory unit fails, the access time becomes excessively great when power is applied to and cut off from the storage elements connected to the bit line.

FIG. 5 shows a pattern of bit lines within one of a plurality of blocks of a memory unit. In the block B0 of the memory unit in FIG. 5, a set of storage elements, arranged on the same column line, and a sense amplifier S0 of the block B0 are interconnected by a pair of bit lines. Also, the other sets of storage elements, arranged on the other column lines, and the sense amplifier S0 are interconnected by the other bit lines. The sense amplifier of each block and the storage elements connected to the same bit line within the block are interconnected by a pair of bit lines. The sense amplifier S0 can detect whether the binary data read from one of the storage elements is equal to "0" or "1", based on whether one of the measurements of the sense amplifier from the bit lines is lower or higher than the other one.

The time of the data transmission from one of the storage elements within one block to the sense amplifier via the bit lines is the greatest when the storage element at the first row (farthest from the sense amplifier) is accessed, and is the smallest when the storage element at the final row (nearest to the sense amplifier) is accessed. Thus, the testing procedure in which only the first-row storage elements and the final-row storage elements in each block of a memory unit are accessed is a very efficient method for detecting a failure in the bit lines of the memory unit.

The block B0 of the memory unit is connected to an equalizing unit (not shown in FIG. 5) via an equalizing line which is located above the first row line. In order to perform a high-speed reading, the bit lines BIT1 and BIT2 are short-circuited. Thus, the time for the high-speed reading is the greatest when the final-row storage element (farthest from the equalizing unit) is accessed, and is the smallest when the first-row storage element (nearest to the equalizing unit) is accessed. Therefore, from this point of view, the testing procedure in which only the first-row storage elements and the final-row storage elements in each block of a memory unit are accessed is a very efficient method for detecting a failure in the bit lines of the memory unit.

As the above mentioned points are not taken into consideration in the proposed methods previously described, the proposed methods are not efficient in detecting a failure in the bit lines of the memory unit. If one of the proposed methods is performed to test a memory unit, a great amount of time is required to complete the normal mode testing procedure. The efficiency and accuracy of detecting a failure in the storage elements and bit lines are insufficient for the recent memory units with high access speed. Also, if a failure in the memory unit is detected by performing one of the proposed methods, it is difficult to detect whether the failure is caused by a storage element or a bit line.

SUMMARY OF THE INVENTION

Accordingly, it is a general object of the present invention to provide an improved memory unit testing method in which the above described problems are eliminated.

Another, more specific object of the present invention is to provide an efficient memory unit testing method by which a failure in bit lines of a memory unit, including a plurality of blocks each including storage elements in rows and columns, is more efficiently detected than with the prior art methods.

Still another object of the present invention is to provide a memory unit testing method which makes it possible to remarkably shorten the time for testing all the bit lines of a memory unit including a plurality of blocks, each block including storage elements in rows and columns.

The above mentioned objects of the present invention are achieved by a method of testing bit lines of a memory unit including a plurality of blocks, each block including storage elements arranged in rows and columns, and individual storage elements being identified by a memory address having a column value, a block value and a row value, which method includes the steps of: alternately writing a set of first binary values and a set of inverted first binary values to blocks having even block values and to blocks having odd block values for all storage elements within each of a plurality of the blocks; setting the memory unit to a stressed condition; alternately reading pieces of binary data from first-row storage elements of the blocks having even block values and from final-row storage elements of the blocks having odd block values by repeatedly inverting the row value of the memory address and incrementing the block value of the memory address for each block; setting the memory unit to a normal condition; and repeating the first setting step, the alternate reading step, and the second setting step for all the columns of the plurality of the blocks.

According to the present invention, pieces of binary data are sequentially read from the first-row and final-row storage elements of the respective blocks of the memory unit when the memory unit is set to a stressed condition. Thus, it is possible to efficiently detect a failure in the bit lines of the memory unit. In addition, according to the present invention, the pieces of the binary data are read from only the first-row storage elements farthest from the sense amplifiers and the final-row storage elements nearest to the sense amplifiers. It is not necessary to read the pieces of the binary data from all the storage elements of the memory unit. Thus, it is possible to remarkably reduce the time needed to complete the testing of the bit lines of the memory unit having the plurality of blocks.

BRIEF DESCRIPTION OF THE DRAWINGS

The above and other objects, features and advantages of the present invention will be more apparent from the following detailed description when read in conjunction with the accompanying drawings in which.

DESCRIPTION OF THE PREFERRED EMBODIMENT

Figure 1:
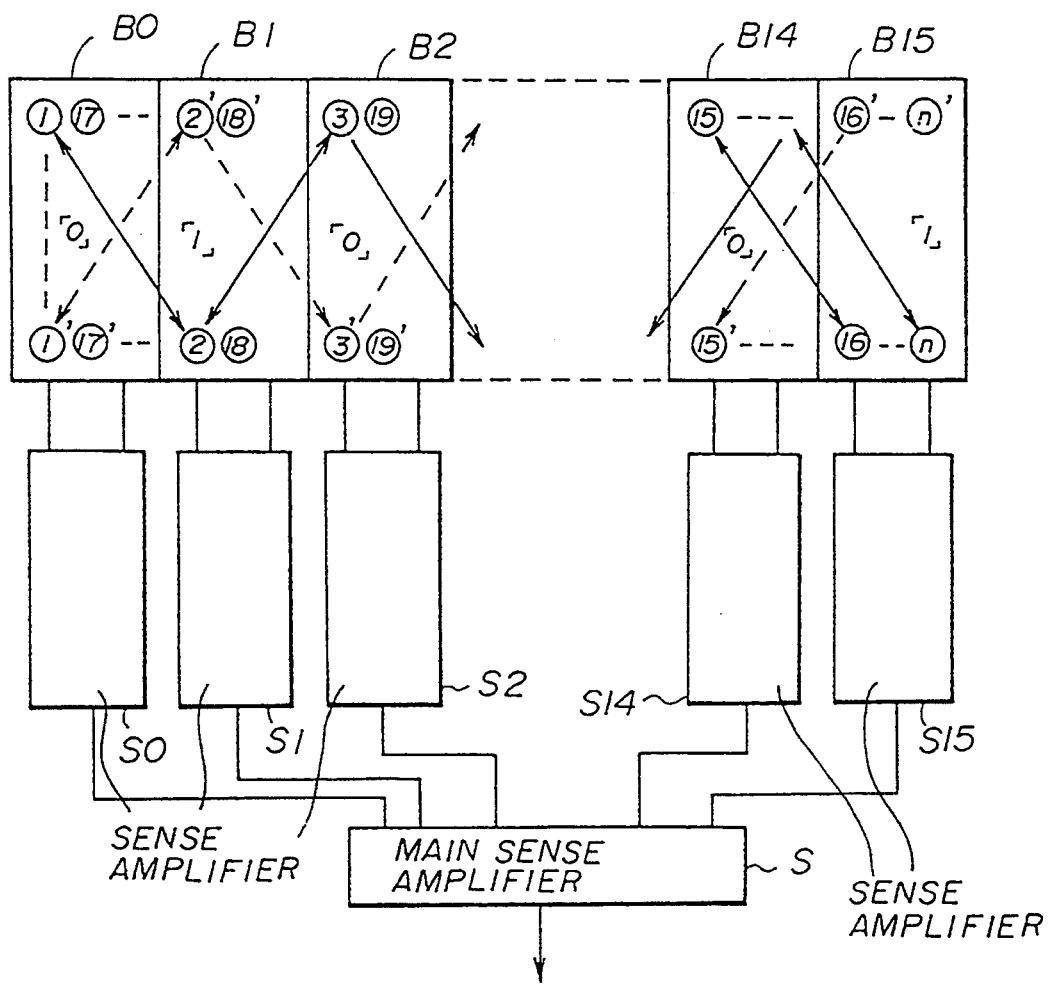
FIG. 1 is a diagram for explaining a memory unit testing method according to the present invention.

A description will now be given of a memory unit testing method according to the present invention with reference to FIG. 1. FIG. 1 shows an example of the memory testing method according to the present invention. In FIG. 1, the memory unit to be tested is comprised of sixteen blocks B0 through B15, each block including storage elements (or storage cells) arranged in rows and columns. Individual storage elements of the memory unit are identified by a memory address having a column value, a block value, and a row value.

In FIG. 1, sixteen sense amplifiers S0 through S15 are respectively connected to the blocks B0 through B15 of the memory unit via bit lines. The sense amplifiers S0 through S15 respectively sense the output level of the storage elements of the blocks B0 through B15, and read pieces of binary data from the storage elements. It is detected whether the pieces of the binary data read by the sense amplifiers are equal to ones or zeros.

More specifically, the sense amplifier of each block and the storage elements on the same column line within the block are interconnected by a pair of bit lines, and the sense amplifier can detect whether the binary data read from one of the storage elements is equal to "0" or "1" based on whether one of the measurements of the sense amplifier from the bit lines is lower or higher than the other one. The results of the detection by the sense amplifiers S0–S15 are supplied to the main sense amplifier S, and the main sense amplifier S supplies the OR of the results of the detection from the sense amplifiers S0–S15.

Thus, by means of the sense amplifiers S0 through S15, it can be detected whether the binary data read from each of the storage elements of the memory unit is equal to "1" or "0". In addition, each sense amplifier writes a set of pieces of binary data to the storage elements of the memory unit within the block.

At the start of the memory unit testing method according to the present invention, the memory unit is set to a normal condition. In the normal condition, the source voltage applied to the memory unit is set to a normal voltage level, for example, 5V.

The memory unit testing method according to the present invention includes an initial writing step and an initial reading step.

At the initial writing step, a set of binary values and a set of inverted binary values are alternately written to the blocks having even block values and to the blocks having odd block values for all the storage elements of the sixteen blocks B0 through B15 of the memory unit.

For example, a set of binary zeros is written to the blocks B0, B2, . . . , B14 and a set of binary ones is written to the blocks B1, B3, . . . , B15 for all the storage elements of the sixteen blocks of the memory unit. Thus, the binary values written to the adjacent blocks of the memory unit are different from each other.

At the initial reading step, the respective binary data is read out from all the storage elements of the sixteen blocks.

After the end of the initial reading step, the memory unit is set to a stressed condition. In order to set the memory unit to the stressed condition, a pause time (e.g. 30 msec) is allowed to elapse at the end of the initial reading step, and the source voltage applied to the memory unit is changed from a normal voltage level to a test voltage level (for example, 4.75V) lower than the normal voltage level.

When the memory unit is set to the stressed condition, pieces of binary data are alternately read from first-row storage elements of the blocks having even block values and from final-row storage elements of the blocks having odd block values, by means of the sense amplifiers S0 through S15, for all the sixteen blocks B0 through B15.

For example, a "0" is read from the storage element (reference numeral circled 1 in FIG. 1) at the first row of the block B0 by the sense amplifier S0, a piece of binary data "1" is read from the storage element (circled 2) at the final row of the block B1 by the sense amplifier S1, a piece of binary data "0" is read from the storage element (circled 3) at the first row of the block B2 by the sense amplifier S2. Finally, a "1" is read from the storage element (circled 16) at the final row of the block B15 by the sense amplifier S15. The pieces of the binary data are respectively read from the first-row and final-row storage elements of the sixteen blocks B0 through B15 as indicated by solid lines in FIG. 1.

The alternating reading procedure mentioned above is called a forward block scanning procedure. In this forward block scanning procedure, the first-row and final-row storage elements of the sixteen blocks B0 through B15 are respectively accessed in a forward direction (from the first block B0 to the final block B15), and a set of binary data is read from the storage elements.

At the end of the forward block scanning procedure, a pause time occurs, and the applied source voltage is changed to the normal voltage level to 5.0V (increased from the test voltage level by a bump voltage). The memory unit is thus set to the normal condition.

After the memory unit is set to the normal condition, the pause time is waited, and the applied source voltage occurs again to 4.75V (the test voltage level). The column value of the memory address is incremented by "1", and the block value thereof is reset to "0", so that the memory unit is set to the stressed condition again.

When the memory unit is set to the stressed condition, the forward block scanning procedure mentioned above is performed for the first-row and final-row storage elements in the second columns of the sixteen blocks in the forward direction from the first block B0 to the final block B15.

In the same manner, the setting of the memory unit to the stressed condition, the forward block scanning procedure, and the setting of the memory unit to the normal condition are repeated until the final column value of the memory address is reached.

After the final cycle of the forward block scanning procedure, the first-row and final-row storage elements of the sixteen blocks B0 through B15 are accessed in the reverse direction by repeating the inversion of the row value and the decrementing of the block value by "1" so as to read a set of binary data from the final-row and first-row storage elements of the blocks.

The reverse block scanning procedure is the reverse procedure relatively to the above mentioned forward block scanning procedure, wherein the row value of the memory address is inverted and the block value thereof is decremented by "1" for the sixteen blocks B0 through B15. Similarly to the above mentioned forward block scanning procedure, the memory unit is set to the stressed condition before the start of the reverse block scanning procedure, and the memory unit is set to the normal condition after the end of the reverse block scanning procedure.

After the final cycle of the reverse block scanning procedure, the pause time occurs and the memory address is changed to a second start memory address that identifies the location (circled 1' in FIG. 1) of the final-row, first-column of the first block B0.

With the second start memory address, the forward block scanning and reverse block scanning procedures are repeated in the same manner as described above, for the first-row and final-row storage elements of the sixteen blocks B0 through B15 of the memory unit. The respective pieces of the binary data are read from the first-row and final-row storage elements of the sixteen blocks B0 through B15 as indicated by dotted lines in FIG. 1 both in the forward direction and in the reverse direction.

After the end of the above mentioned procedures with the second start memory address, a set of the inverted binary values ones and a set of the binary values zeros are alternately written to the blocks having even block values and to the blocks having odd block values for all the storage elements of the sixteen blocks B0 through B15.

With the secondary writing procedure described above, the forward block scanning and reverse block scanning procedures are repeated in the same manner as described above, for the first-row and final-row storage elements of the sixteen blocks B0 through B15 of the memory unit.

In the example of the memory unit shown in FIG. 1, a single bit is read from one of the storage elements of the memory unit, for the sake of convenience. In a memory unit in which a plurality of bits are read from one of the storage elements of the memory unit, it is necessary to provide a plurality of testing control systems for testing bit lines of the memory unit.

Figure 2:
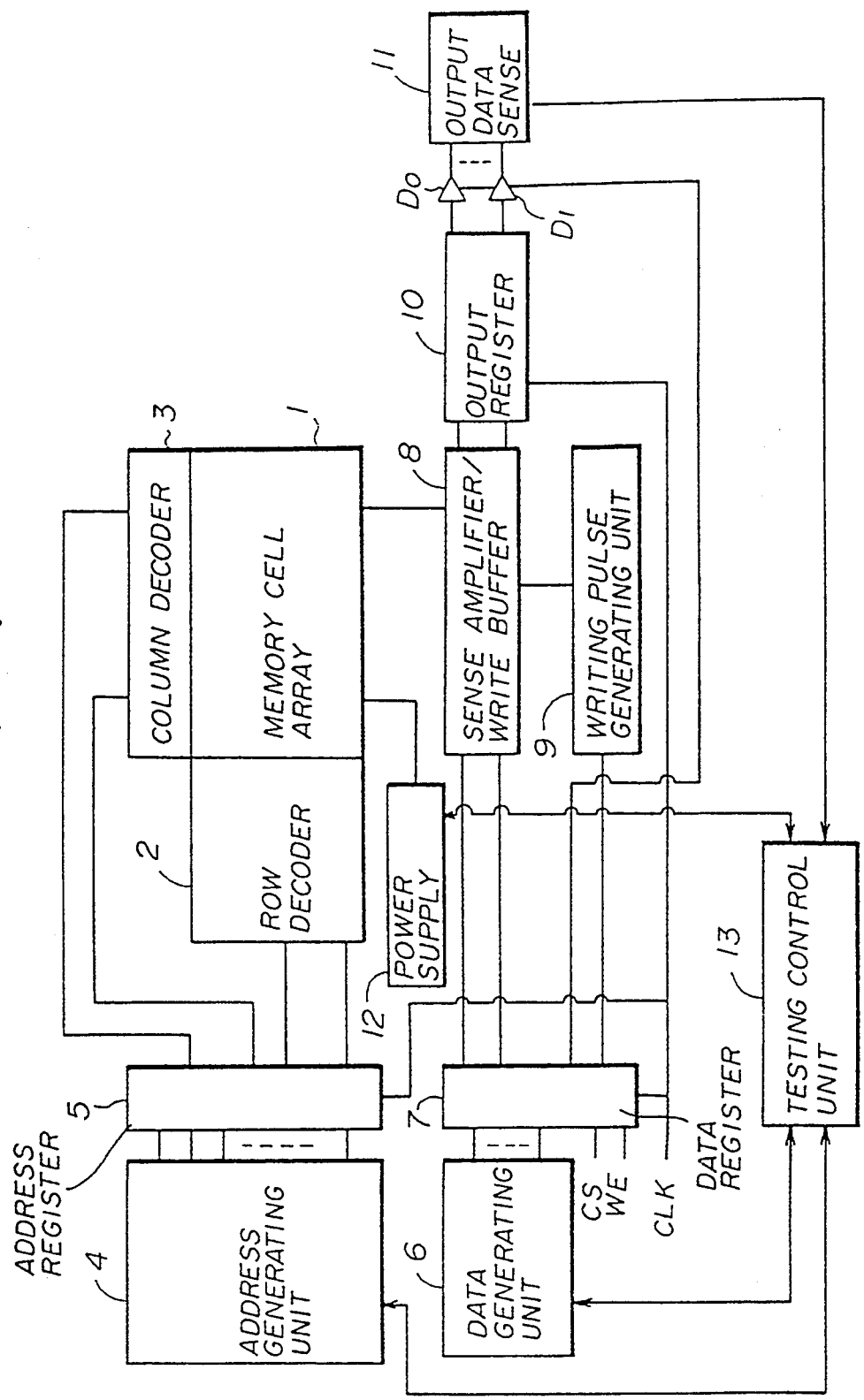
FIG. 2 is a block diagram showing an embodiment of a testing control system for performing the memory unit testing method according to the present invention.

Next, a description will be given of a testing control system for performing the memory unit testing method according to the present invention. FIG. 2 shows a preferred embodiment of the testing control system. In FIG. 2, a memory cell array 1 is a memory unit to be tested by the testing control system.

This memory cell array 1 is comprised of a plurality of blocks, for example, sixteen blocks B0 through B15 shown in FIG. 1.

The memory cell array 1 is coupled to a row decoder 2 and a column decoder 3. Both the row decoder 2 and the column decoder 3 are connected to an address register 5, and the address register 5 is connected to an address generating unit 4.

The address generating unit 4 generates a memory address which indicates the location of one of the storage elements of the memory cell array 1 at which the content of the memory cell array 1 is read or test data is written to the memory cell array 1. The address register 5 temporarily holds the memory address supplied from the address generating unit 4, and transfers the memory address to both the row decoder 2 and the column decoder 3. The row decoder 2 determines a row value for the supplied memory address, and selects one of a plurality of rows of the memory cell array 1 in accordance with the row value. The column decoder 3 determines both a column value and a block value for the supplied memory address, selects one of a plurality of columns of the memory cell array 1 in accordance with the column value, and selects one of the plurality of blocks of the memory cell array 1 in accordance with the block value.

In the testing control system in FIG. 2, a data generating unit 6 generates test data that is written to the memory cell array 1. A data register 7 holds a set of bits of the test data supplied from the data generating unit 6.

A sense amplifier/write buffer 8 senses the output level of the storage elements of the memory cell array 1 and converts the measurement of the output level to a piece of output binary data. The sense amplifier/write buffer 8 holds the test data to be written to the memory cell array 1. The sense amplifier/write buffer 8 is comprised of, for example, the main sense amplifier S and the sense amplifiers S0 through S15 in FIG. 1.

A write pulse generating unit 9 supplies a writing pulse to the sense amplifier/write buffer 8 by which the test data held by the sense amplifier/write buffer 8 is written to the memory cell array 1.

An output register 10 holds the output binary data of the sense amplifier/write buffer 9 obtained from the memory cell array 1. The output data held by the output register 10 is transferred to an output data sensing unit 11 via drivers D0 and D1. The output data sensing unit 11 senses a value, corresponding to the output binary data supplied from the output register 10, and supplies the value to the test control unit 13.

A power supply 12 applies source power to the memory cell array 1. The source power applied to the memory cell array 1 can be set to one of a few voltage values, for example, 5V (normal voltage), 4.75V (test voltage), and 4.5V.

A testing control unit 13 performs several test control procedures for testing the memory cell array 1. For example, the memory address control for controlling the operation of the address generating unit 4, the test data control for controlling the operation of the data generating unit 6, the supply voltage control for controlling the power supply 12, and the discrimination of the test result from the output data sensing unit 11.

Figure 4A:
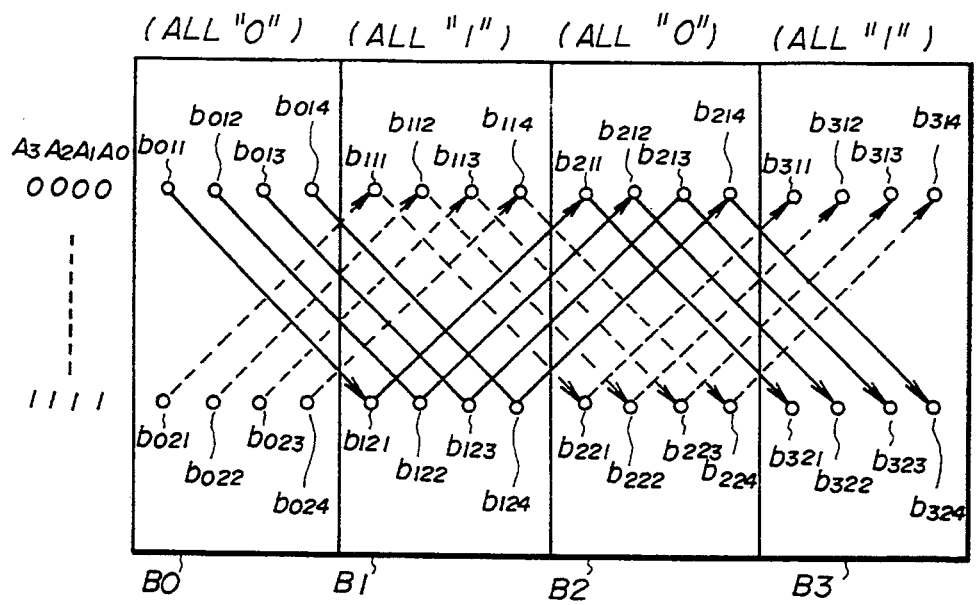
FIGS. 4A and 4B are diagrams for explaining the procedures of the memory unit testing method according to the present invention.

Next, a description will be given, with reference to FIGS. 4A and 4B, of the memory address control procedures performed by the testing control system in FIG. 2. FIG. 4A shows an example of a memory unit which is tested according to the memory unit testing method of the present invention. For the sake of convenience, a memory unit with a 256k storage capacity including four 16×4 blocks is shown in FIG. 4A. Each block includes a set of storage elements arranged in 16 rows and 4 columns.

At the initial writing step of the memory unit testing method, a set of values of zeros and a set of values of ones are alternately written to the four blocks B0–B3 of the memory unit block by block. For example, the values of zeros are written to all the storage elements of the block B0, the values of ones are written to all the storage elements of the block B1, the values of zeros are written to all the storage elements of the block B2, and the values of ones are written to all the storage elements of the block B3. The four sense amplifiers (not shown in FIG. 4A) are connected to the blocks on the bottom side of the memory unit in FIG. 4A.

The memory unit shown in FIG. 4A has a 256k storage capacity, and individual storage elements of this memory unit are identified by a memory address including a column value, a block value, and a row value. The four least significant digits A3-A0 of the memory address are used to indicate the row value, the two most significant digits A7-A6 are used to indicate the column value, and the remaining two digits A5 and A4 are used to indicate the block value.

Figure 4B:
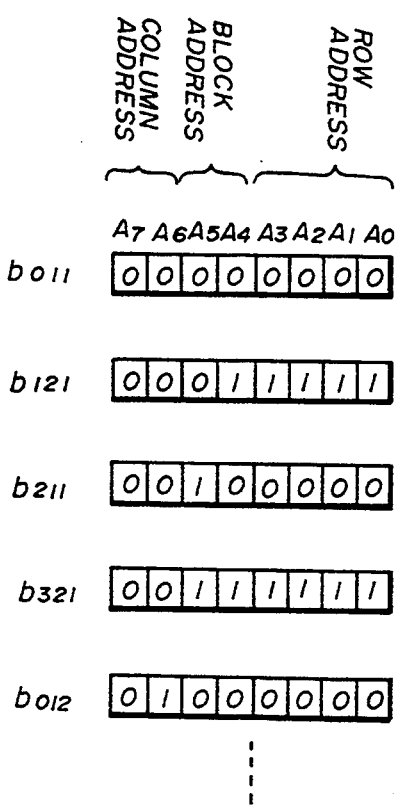
Figure 5:
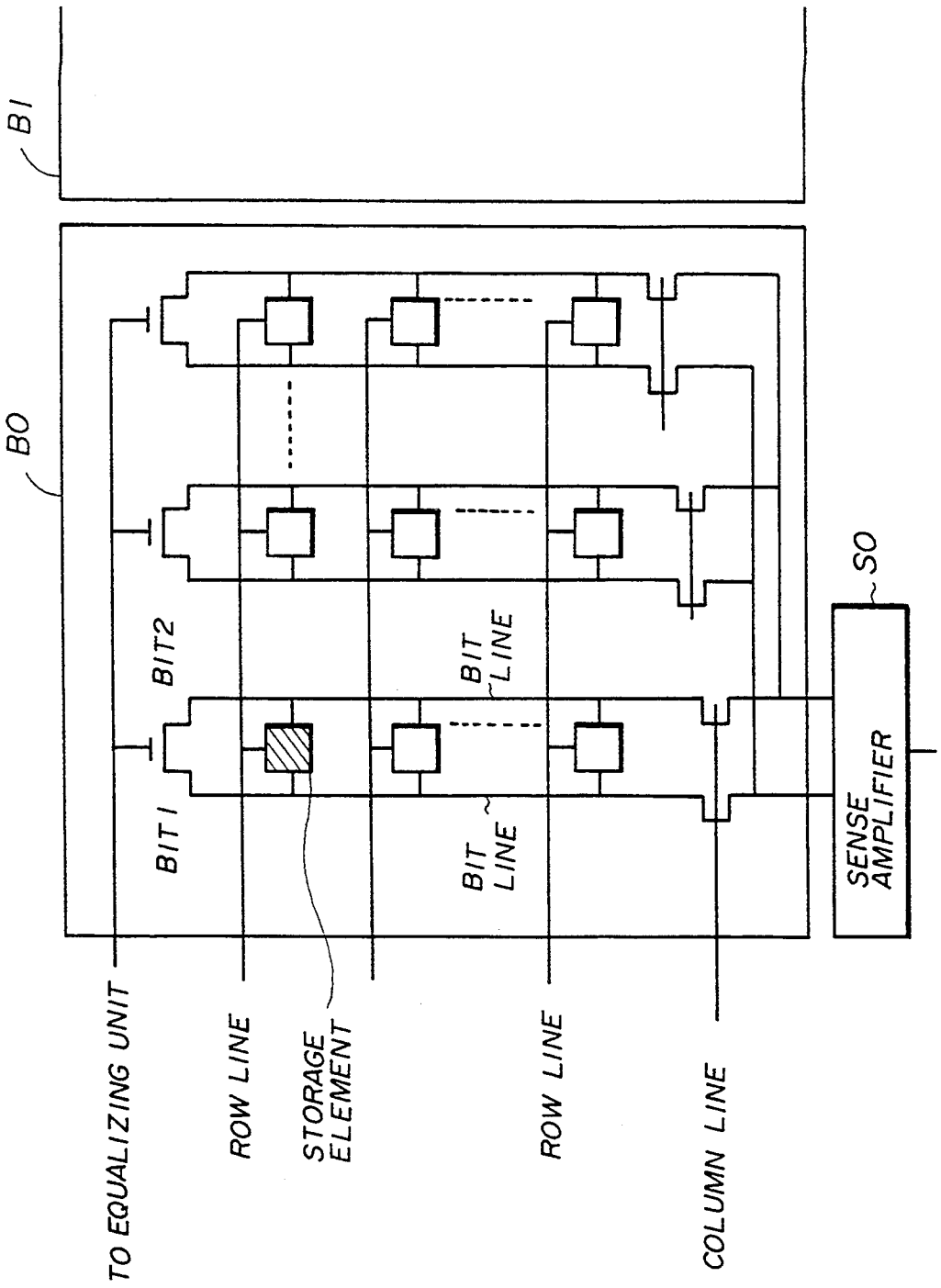
FIG. 5 is a diagram showing a pattern of bit lines by which a sense amplifier and storage elements within one block of a memory unit are interconnected.

FIG. 4B shows a list of memory address changes used for the memory address control procedures in which the four sense amplifiers gain access to the storage elements b011, b121, b211 and b321, respectively. In this example, the symbol "b000" refers to the location of the storage element. The leftmost numeral of the symbol "b000" indicates the block value, the rightmost numeral indicates the column value, and the middle numeral indicates either the first row ("1") or the final row ("2") of the same column.

As shown in FIGS. 4A and 4B, when the storage element "b011" (located at the first row and first column of the first block B0) is accessed, all the digits of the memory address are set to "0". The memory address at this time is "00000000". When the accessed storage element is changed from "b011" to "b121", the row value of the four least significant digits A3-A0 is inverted to "1", the block value of the two intermediate digits A5-A4 is incremented by "1", and the column value of the two most significant digits A7-A6 remains unchanged. The memory address at this time is "00011111". When the accessed storage element is changed from "b121" to "b211", the row value is inverted to "0" and the block value is incremented by "1" in the same manner. The memory address at this time is "00100000".

Thus, the storage elements "b011", "b121", "b211" and "b321" can be accessed by repeating the inversion of the row value of the memory address and the incrementing of the block value by "1".

In addition, if the row value of the memory address corresponding to the storage element "b321" (located in the final row and first column of the final block B3) is inverted and the block value thereof is further incremented by "1", the accessed storage element can be changed from "b321" to "b012". The increment of the block value at this time causes the column value to be incremented by "1" and causes the block value to be reset to "0" at the same time. Thus, the memory address at this time is changed from "00111111" to "01000000".

By repeating the above mentioned memory address control procedures, the four sense amplifiers gain access to, in the forward direction, the first-row and final-row storage elements "b011" through "b321", "b012" through "b322", "b013" through "b323", and "b014" through "b324" as indicated by solid lines in FIG. 4A.

In addition, the four sense amplifiers gain access to, in the reverse direction (i.e. opposite to the direction indicated by the arrow in FIG. 4A), the first-row and final-row storage elements, which are the same as indicated by the solid lines in FIG. 4A, by repeating the inversion of the row value of the memory address and the decrementing of the block value by "1" after the end of the forward block scanning procedure described above.

For example, when the accessed storage element is changed from "b324" to "b214", the row value of the memory address corresponding to the storage element "b324" is inverted to all "0" and the block value thereof is decremented by "1". Thus, by repeating the above mentioned memory address control procedures, the four sense amplifiers can gain access to the storage elements "b324" through "b014", "b323" through "b013", "b322" through "b012", and "b321" through "b011" in the reverse direction.

In addition, the four sense amplifiers gain access to, in the forward direction, the final-row and first-row storage elements "b021", "b111", "b221", and "b311", as indicated by dotted lines in FIG. 4A, by repeating the inversion of the row value of the memory address and the incrementing of the column value thereof by "1" after the end of the reverse accessing procedure described above.

For example, when the final-row storage element "b021" (located at the final row and final column of the first block B0) is accessed, the four least significant digits A3-A0 (the row value) of the memory address are set to "1" and the four most significant digits A7-A4 (the column and block values) of the memory address are set to "0", that is, the memory address at this time is "00001111". When the accessed storage element is changed from "b021" to "b111", the row value of the memory address is inverted to "0", the block value is incremented by "1", and the column value remains unchanged. The memory address at this time is "00010000".

Accordingly, by repeating the inversion of the row value and the incrementing of the block value by "1" in the same manner, the final-row and first-row storage elements "b021" through "b311", "b022" through "b312", "b023" through "b313", and "b024" through "b314" indicated by the dotted lines in FIG. 4A can be accessed in the forward direction from the first block B0 to the final block B3. In addition, the storage elements which are the same as indicated by the dotted lines in FIG. 4A can be accessed in the reverse direction from the final block B3 to the first block B0.

Next, a description will be given, with reference to FIG. 3, of the operation of the testing control system in FIG. 2.

Figure 3:
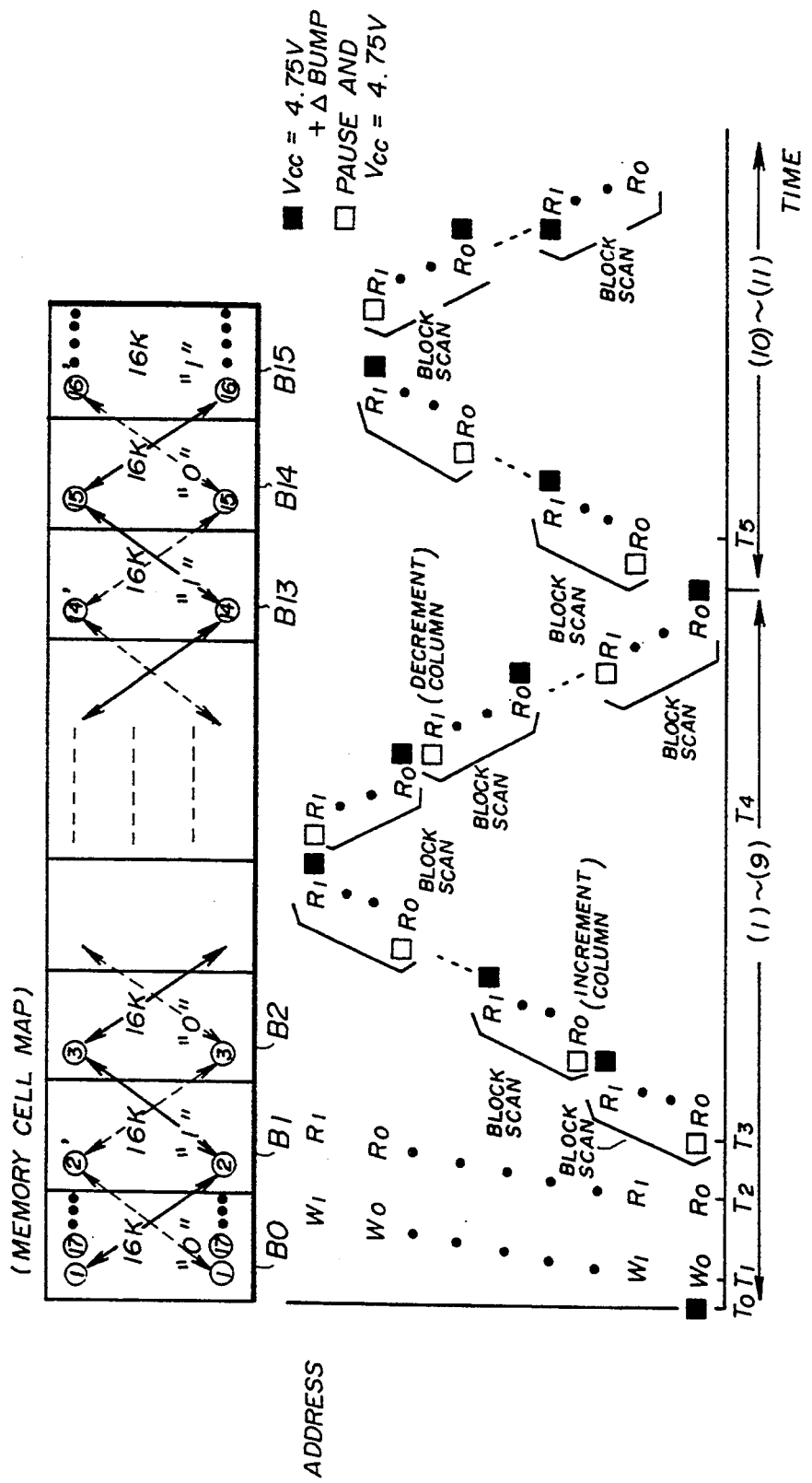
FIG. 3 is a time chart for explaining the operation of the testing control system in FIG. 2.

FIG. 3 shows an example of the memory cell array to be tested according to the present invention. This memory unit includes sixteen blocks B0 through B15, and each block includes 16k storage elements arranged in columns and rows. In addition, FIG. 3 shows the relationship between the elapsed time and the memory address when the memory unit testing method is performed by the testing control system in FIG. 2. In FIG. 3, the black square symbol indicates the normal condition in which the voltage Vcc applied to the memory cell array is set to 5.0V (4.75V+bump voltage), and the white square symbol indicates the stressed condition in which the applied voltage Vcc is set to 4.75V after the end of the pause time (e.g. 30 msec). The difference between 5.0V and 4.75V is equivalent to the bump voltage. The applied voltage Vcc in the stressed condition may be set to a different voltage level, for example, 4.5V. Also, the applied voltage Vcc in the normal condition is not limited to 5.0V, and a different voltage level may be used.

The respective steps of the memory unit testing method performed by the testing control system in FIG. 2 will now be described with reference to FIG. 3.

(1) At the time T0, the testing control unit 13 controls the power supply 12 so that the source voltage Vcc applied to the memory cell array 1 is set to 5.0V. The memory array unit 1 is set to the normal condition at the start of the memory unit testing procedure.

(2) At the time T1, the testing control unit 13 controls the address generating unit 4, the data generating unit 6, the data register 7 and the other units, so that the sense amplifier/write buffer 8 alternately writes a set of the binary values "zero" and a set of the inverted binary values "one" to the blocks with even block values and the blocks with odd block values for all the storage elements of the sixteen blocks B0–B15 of the memory array unit 1. Thus, the binary data written to the storage elements of the sixteen blocks alternates from block to block.

At the time T2, the testing control unit 13 controls the output data sensing unit 11 to read the respective binary data from all the storage elements of the sixteen blocks B0–B15 of the memory cell array 1, so that it is detected whether or not all the data read from the memory array unit 1 are in accordance with the written data.

In the time chart shown in FIG. 3, the characters "W0" and "W1" respectively indicate the writing operations of the values "zero" and the values "one", and the characters "R0" and "R1" respectively indicate the reading operations of the values "zero" and the values "one".

(3) After the end of the initial reading step, the testing control unit 13 controls the address generating unit 4 to generate the memory address which is set to "00000000" as the start memory address. The forward block scanning procedure for reading a set of binary data from the storage elements of the sixteen blocks starts from the storage element identified by this start address.

In the example in FIG. 3, the start storage element is located in the first row and first column of the first block B0. As the memory unit in FIG. 3 has the storage capacity of 256k bits and includes sixteen blocks, and a memory cell board in which individual storage cells are identified by an 8-bit memory address is used, for the sake of convenience.

(4) The pause time (e.g. 30 msec) between the end of the initial reading step and the start of the forward block scanning procedure is initiated.

(5) After the end of the pause time, the testing control unit 13 controls the power supply 12 so that the source voltage applied to the memory cell array 1 is changed to 4.75V. The memory cell array 1 is thus set to the stressed condition. The testing control unit 13 controls the address generator 4 to start the transferring of the memory address to the address register 5. One of the storage elements in the memory cell array is selected by the row decoder 2 and the column decoder 3 in accordance with the memory address held by the address register 5.

The binary data is read from the storage element in the first row and first column of the block B0 by the sense amplifier/write buffer 8. The read data of the sense amplifier/write buffer 8 is transferred to the output data sensing unit 11 via the output register 10 and the drivers D0 and D1. At the output data sensing unit 11, the value of the read data is detected. The detected value is supplied from the output data sensing unit 11 to the testing control unit 13.

(6) The testing control unit 13 controls the address generator 4 and the sense amplifier/write buffer 8 to gain access to, in the forward direction (from the block B0 to the block B15), the first-row and final-row storage elements in the first columns of the sixteen blocks B0–B15 by repeating the inversion of the row value of the memory address and the incrementing of the block value by "1" block by block for all the blocks B0–B15. The sense amplifier/write buffer 8 reads a set of binary data from the first-row and final-row storage elements (indicated by solid lines in the memory unit example in FIG. 3) of the sixteen blocks B0–B15. This procedure is called the forward block scanning procedure. If the block value of the memory address at the end of the forward block scanning procedure is incremented by "1", the column value can be incremented by "1" and the block value can be reset to "0".

(7) At the end of the forward block scanning procedure, by which the storage elements of the sixteen blocks B0–B15 have been accessed as in the above step (6), the testing control unit 13 controls the power supply 12 to increase the applied source voltage Vcc by the bump voltage to 5.0V. The memory cell array 1 is thus set to the normal condition.

(8) The pause time between the end of the previous block scanning procedure and the start of the following block scanning procedure is initiated. After the pause time, the testing control unit 13 controls the power supply 12 to change the applied source voltage Vcc to 4.75V. The memory cell array 1 is thus set to the stressed condition.

As described in the above step (6), the testing control unit 13 controls the address generating unit 4 so that the block value of the memory address at the end of the forward block scanning procedure is incremented. The column value of the memory address is thus incremented by "1" and the block value thereof is reset to "0". Thus, following the storage element located in the final row and first column of the block B15, the storage element located at the first row and second column of the block B0 is accessed.

The first-row and final-row storage elements in the second columns of the sixteen blocks B0–B15 are accessed in the forward direction by repeating the inversion of the row value and the incrementing of the block value, to read a set of binary data from the storage elements of the blocks B0–B15 of the memory cell array 1. The forward block scanning procedure described above is repeated until the final column value is reached. In the case of a 256k memory unit including sixteen blocks, the storage elements are arranged in 32 columns and 16 blocks, and the forward block scanning procedure from the first block B0 to the final block B15 is repeated 32 times.

(9) At the end of the above described forward block scanning procedure in the above step (8), the binary data is finally read from the storage element at the final row and final column of the final block B15. At this time, the pause time occurs between the end of the forward block scanning procedure and the start of the reverse block scanning procedure.

The testing control unit 13 controls the address generating unit 4 and the sense amplifier/write buffer 8, so that the first-row and final-row storage elements of the sixteen blocks B0–B15 are accessed in the reverse direction (from the final block B15 to the first block B0) by repeating the inversion of the row value and the decrementing of the block value by "1" to read a set of binary data from the storage elements of the blocks B0–B15 of the memory cell array 1. The reverse block scanning procedure is the reversed procedure relatively to the above steps (4)–(8) wherein the row value is inverted and the block value is decremented by "1", block by block, for the sixteen blocks B0–B15. The reverse block scanning procedure starts from the final column value, and is repeated until the first column value is reached.

(10) After the end of the reverse block scanning procedure in the above step (9), the pause time is initiated. After the pause time, the testing control unit 13 controls the address generating unit 4 to change the start memory address to "00001111".

(11) With this start memory address, the forward block scanning and reverse block scanning procedures in the above steps (4) through (9) are repeated in the same manner.

(12) After the end of the above step (11), the testing control unit 13 controls the sense amplifier/write buffer 8 to alternately write a set of the binary values of ones and a set of the inverted binary values of zeros to the blocks with even block values and the blocks with odd block values respectively for all the storage elements of the sixteen blocks B0–B15. After the end of this initial writing step, the above steps (1) through (11) are repeated.

As described in the foregoing, a set of binary data is read from the storage elements of the sixteen blocks each time the memory cell array 1 is set to the stressed condition. In comparison with the conventional testing method in which the setting of the memory unit to the stressed condition is required to read a piece of binary data from each storage element, the time for completing the testing of the memory unit can be remarkably reduced according to the present invention. Also, according to the present invention, reading the binary data from all the storage elements of the memory unit is not necessary, and the testing of the memory unit is completed by reading the binary data from only the first-row and final-row storage elements of the memory unit.

Further, the present invention is not limited to the above described embodiment, and variations and modifications may be made without departing from the scope of the present invention. For example, the memory unit tested in the above described embodiment has a given storage capacity and the storage elements are arranged in a specific matrix formation, but the present invention is not limited to a specific storage capacity nor a specific memory structure.

What is claimed is:

1. A method of testing bit lines of a memory unit, the memory unit including a plurality of blocks, each block including storage elements arranged in rows and columns and individual storage elements being identified by a memory address having a column value, a block value and a row value, said method comprising the steps of:

alternately writing a set of first binary values and a set of inverted first binary values, obtained by inverting said first binary values, respectively to blocks having even block values and to blocks having odd block values for all the storage elements within each of the plurality of the blocks;

in a first setting step, setting the memory unit to a stressed condition;

alternately reading pieces of binary data from first-row storage elements of the blocks having even block values and from final-row storage elements of the blocks having odd block values by repeatedly inverting the row value of the memory address and incrementing the block value of the memory address for each block;

in a second setting step, setting the memory unit to a normal condition; and repeating said first setting step, said alternately reading step, and said second setting step, in succession, for all the columns of the plurality of the blocks.

2. A method according to claim 1, wherein said pieces of binary data are alternately read from said first-row storage elements of the blocks having even block values and from said final-row storage elements of the blocks having odd block values by a plurality of sense amplifiers, said plurality of sense amplifiers being respectively connected to the blocks of the memory unit via bit lines.

3. A method according to claim 2, wherein said first-row storage elements of the blocks having even block values are located at the locations farthest from the sense amplifiers among the storage elements of the respective blocks.

4. A method according to claim 2, wherein said final-row storage elements of the blocks having odd block values are located at the locations nearest to the sense amplifiers, among the storage elements of the respective blocks.

5. A method according to claim 1, wherein said method comprises the further steps of:
after the end of said repeating step, setting the memory unit to a stressed condition; and
in a further alternately writing step, alternately writing the inverted first binary values and the first binary values respectively to the blocks having even block values and to the blocks having odd block values for all the storage elements within each of the plurality of the blocks.

6. A method according to claim 5, wherein said method further comprises, after the end of said further alternately writing step, the yet further steps of:
in a first, yet further setting step, setting the memory unit to a stressed condition;
in a yet further alternatively reading step, alternately reading pieces of binary data from final-row storage elements of the blocks having even block values and from first-row storage elements of the blocks having odd block values by repeatedly inverting the row value of the memory address and incrementing the block value of the memory address for each block;
in a second, yet further setting step, setting the memory unit to a normal condition; and
repeating said first yet further setting step, said yet further alternately reading step, and said second yet further setting step for all the columns of the plurality of the blocks.

7. A method according to claim 1, wherein said alternately reading step is repeatedly performed both in a forward direction, from the first-row and final-row storage elements of first columns of the plurality of the blocks to the first-row and final-row storage elements of final columns of the plurality of the blocks, and in a reverse direction, from said first-row and final-row storage elements of said final columns to said first-row and final-row storage elements of said first columns.

* * * * *

UNITED STATES PATENT AND TRADEMARK OFFICE
CERTIFICATE OF CORRECTION

PATENT NO. : 5,396,466
DATED : Mar. 7, 1995
INVENTOR(S) : NAKANO et al.

It is certified that error appears in the above-indentified patent and that said Letters Patent is hereby corrected as shown below:

Col. 1, line 49, after "addresses" insert --,--;
line 50, after "addresses" delete ",".

Col. 8, line 48, after ""b324"" insert --,--;
line 50, after "(i.e." insert --,--.

Col. 9, line 66, after "values" insert --,--;
line 67, after "values" insert --,--.

Col. 12, line 10, after "values" insert --,--; and after "respectively" insert --,--.

Col. 13, line 10 (claim 3, line 4), after "amplifiers" insert --,--.

Signed and Sealed this

Thirtieth Day of November, 1999

Attest:

Q. TODD DICKINSON

Attesting Officer

Acting Commissioner of Patents and Trademarks